US012744541B2

(12) United States Patent
Shin et al.

(10) Patent No.: US 12,744,541 B2
(45) Date of Patent: Sep. 22, 2026

(54) ELECTRONIC DEVICE AND METHOD FOR ANALOG COMPUTING CIRCUIT

(71) Applicant: Samsung Electronics Co., Ltd., Suwon-si (KR)

(72) Inventors: Chang-Woo Shin, Suwon-si (KR); Minje Kim, Suwon-si (KR); Sungmeen Myung, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 159 days.

(21) Appl. No.: 18/738,844

(22) Filed: Jun. 10, 2024

(65) Prior Publication Data

US 2025/0226832 A1 Jul. 10, 2025

(30) Foreign Application Priority Data

Jan. 9, 2024 (KR) ........................ 10-2024-0003723

(51) Int. Cl.
*H03M 1/10* (2006.01)
*H03M 1/06* (2006.01)

(52) U.S. Cl.
CPC ....... *H03M 1/1014* (2013.01); *H03M 1/0612* (2013.01)

(58) Field of Classification Search
CPC .. H03M 1/124; H03M 1/1009; H03M 1/1014; H03M 1/0612
See application file for complete search history.

(56) References Cited

U.S. PATENT DOCUMENTS 10,079,058 B1* 9/2018 Eleftheriou ............. G11C 11/54
10,262,733 B2 4/2019 Yang et al.
10,325,655 B2* 6/2019 Ge .......................... G11C 7/04
10,999,549 B2* 5/2021 Tang ....................... H03M 1/36
11,663,458 B2 5/2023 Joshi et al.
2017/0214411 A1* 7/2017 Liu ..................... H03M 1/1009
2020/0136633 A1* 4/2020 Lee ..................... H03M 1/1014
2020/0280321 A1* 9/2020 Lu ......................... H03M 1/168
2020/0404205 A1* 12/2020 Tang ....................... H03M 1/36
2021/0037201 A1* 2/2021 Tantawy .............. H04N 25/778
2021/0233600 A1* 7/2021 Roy ....................... G11C 29/50
2022/0173745 A1* 6/2022 Kim .................... H03M 1/1014
2022/0357922 A1* 11/2022 Lee ....................... G06F 7/5443
2023/0057756 A1 2/2023 Zhang et al.
(Continued)

FOREIGN PATENT DOCUMENTS

KR 10-2023-0050134 A 4/2023

OTHER PUBLICATIONS

Jung, Seungchul, et al. "A crossbar array of magnetoresistive memory devices for in-memory computing." Nature 601.7892, Jan. 12, 2022. (pp. 211-227).

*Primary Examiner* — Lam T Mai
(74) *Attorney, Agent, or Firm* — NSIP Law

(57) ABSTRACT

An electronic device includes an analog computing circuit comprising a plurality of rows comprising a plurality of first rows to which a data signal for computations is input and one or more second rows to which a calibration signal for error calibration is input, and a plurality of columns connected to the plurality of rows and configured to output a computation result in which an error is calibrated, by accumulating signals transmitted from the connected plurality of rows in response to an input of the data signal and the calibration signal.

20 Claims, 9 Drawing Sheets

(56) References Cited

U.S. PATENT DOCUMENTS

| | | | | |
|---|---|---|---|---|
| 2023/0387933 | A1* | 11/2023 | Nagarajan | H03M 1/1014 |
| 2024/0291137 | A1* | 8/2024 | Kasani | H01Q 3/36 |
| 2024/0396568 | A1* | 11/2024 | Liu | H03M 1/181 |
| 2025/0341976 | A1* | 11/2025 | Saito | G06F 3/0625 |

* cited by examiner

ELECTRONIC DEVICE AND METHOD FOR ANALOG COMPUTING CIRCUIT

CROSS-REFERENCE TO RELATED APPLICATIONS

This application claims the benefit under 35 USC § 119(a) of Korean Patent Application No. 10-2024-0003723, filed on Jan. 9, 2024 in the Korean Intellectual Property Office, the entire disclosure of which is incorporated herein by reference for all purposes.

BACKGROUND

1. Field

The following description relates to an electronic device and method for an analog computing circuit.

2. Description of Related Art

A neural network model may include a large amount of matrix vector multiplication (MVM) computations based on multiplication-and-accumulation (MAC). In the neural network model, a large amount of computations may be required because computation of a multi-layered structure is repeated. Therefore, to reduce the amount of computations, not only a lightweight technique, such as pruning and quantization, but also a technique, such as minimizing data movement and streamlining data reuse, may be implemented.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one or more general aspects, an electronic device includes an analog computing circuit comprising a plurality of rows comprising a plurality of first rows to which a data signal for computations is input and one or more second rows to which a calibration signal for error calibration is input, and a plurality of columns connected to the plurality of rows and configured to output a computation result in which an error is calibrated, by accumulating signals transmitted from the connected plurality of rows in response to an input of the data signal and the calibration signal.

The plurality of rows may be connected to the plurality of columns through resistive elements, and resistive elements, among the resistive elements, connecting the one or more second rows to the plurality of columns may have a weight value for the error calibration.

The plurality of columns may be connected to one or more analog-to-digital converters (ADCs), and a calibration signal transmitted to columns connected to one of the one or more ADCs and a weight value of resistive elements connected to the columns connected to the one of the one or more ADCs may be determined based on calibration values of the columns connected to the one of the one or more ADCs and a calibration value of one of the one or more ADCs.

The calibration value of the one of the one or more ADCs may be determined to be either one of a value determined based on the calibration values of the columns, and one of the calibration values of the columns.

The calibration value of the one of the one or more ADCs may be determined to be an average value of the calibration values of the columns connected to the one of the one or more ADCs.

The calibration value of the one of the one or more ADCs may be determined to be a maximum value of the calibration values of the columns connected to the one of the one or more ADCs.

The calibration value of the one of the one or more ADCs may be determined to be a minimum value of the calibration values of the columns connected to the one of the one or more ADCs.

A number of the one or more second rows may be determined based on a range of an error for the error calibration, a range of the calibration signal, and a range of a weight value that resistive elements connecting the one or more second rows to the plurality of columns are configured to have.

An amount of computations that the analog computing circuit is configured to compute at a time may decrease as a number of the one or more second rows increases.

In response inputting to the computation result of the analog computing circuit to another analog computing circuit, a computation result of one or more columns of the plurality of columns may be input to the other analog computing circuit for error calibration of the other analog computing circuit.

A weight value of resistive elements that transmit the data signal may be 0 among resistive elements connected to the one or more columns of the plurality of columns.

The electronic device may include one or more processors configured to control the electronic device, and monitor whether the analog computing circuit operates normally based on a computation result of columns connected to one of one or more ADCs connected to the plurality of columns.

In one or more general aspects, a processor-implemented method includes inputting a data signal for computations to a plurality of first rows of an analog computing circuit and inputting a calibration signal for error calibration to one or more second rows of the analog computing circuit, and outputting a computation result in which an error is calibrated, by accumulating signals transmitted from a plurality of rows through a plurality of columns connected to the plurality of rows in response to an input of the data signal and the calibration signal, wherein the plurality of rows comprises the plurality of first rows and the one or more second rows.

The plurality of rows may be connected to the plurality of columns through resistive elements, and resistive elements, among the resistive elements, connecting the one or more second rows to the plurality of columns may have a weight value for the error calibration.

The plurality of columns may be connected to one or more analog-to-digital converters (ADCs), and a calibration signal transmitted to columns connected to one of the one or more ADCs and a weight value of resistive elements connected to the columns connected to the one of the one or more ADCs may be determined based on a calibration value of the columns connected to the one of the one or more ADCs and a calibration value of the one of the one or more ADCs.

A number of the one or more second rows may be determined based on a range of an error for the error calibration, a range of the calibration signal, and a range of a weight value that resistive elements connecting the one or more second rows to the plurality of columns are configured to have.

An amount of computations that the analog computing circuit is configured to compute at a time may decrease as a number of the one or more second rows increases.

The method may include, in response to inputting the computation result of the analog computing circuit to another analog computing circuit, inputting a computation result of one or more columns of the plurality of columns to the other analog computing circuit for error calibration of the other analog computing circuit.

The method may include monitoring whether the analog computing circuit operates normally based on a computation result of columns connected to one of one or more ADCs.

In one or more general aspects, a manufacturing method includes computing a calibration value for each of a plurality of columns comprised in an analog computing circuit by analyzing an output of the analog computing circuit, determining a calibration value for one or more analog-to-digital converters (ADCs) connected to the plurality of columns based on the calibration value for each of the plurality of columns, determining a calibration signal to be input to the analog computing circuit for error calibration, one or more second rows to which the calibration signal is input, and a weight value of resistive elements connecting the one or more second rows to the plurality of columns for the error calibration, based on the calibration value for each of the plurality of columns and the calibration value for the one or more ADCs, and setting the analog computing circuit to have the calibration signal, the one or more second rows, and the weight value of the resistive elements.

Other features and aspects will be apparent from the following detailed description, the drawings, and the claims.

Figure 1:
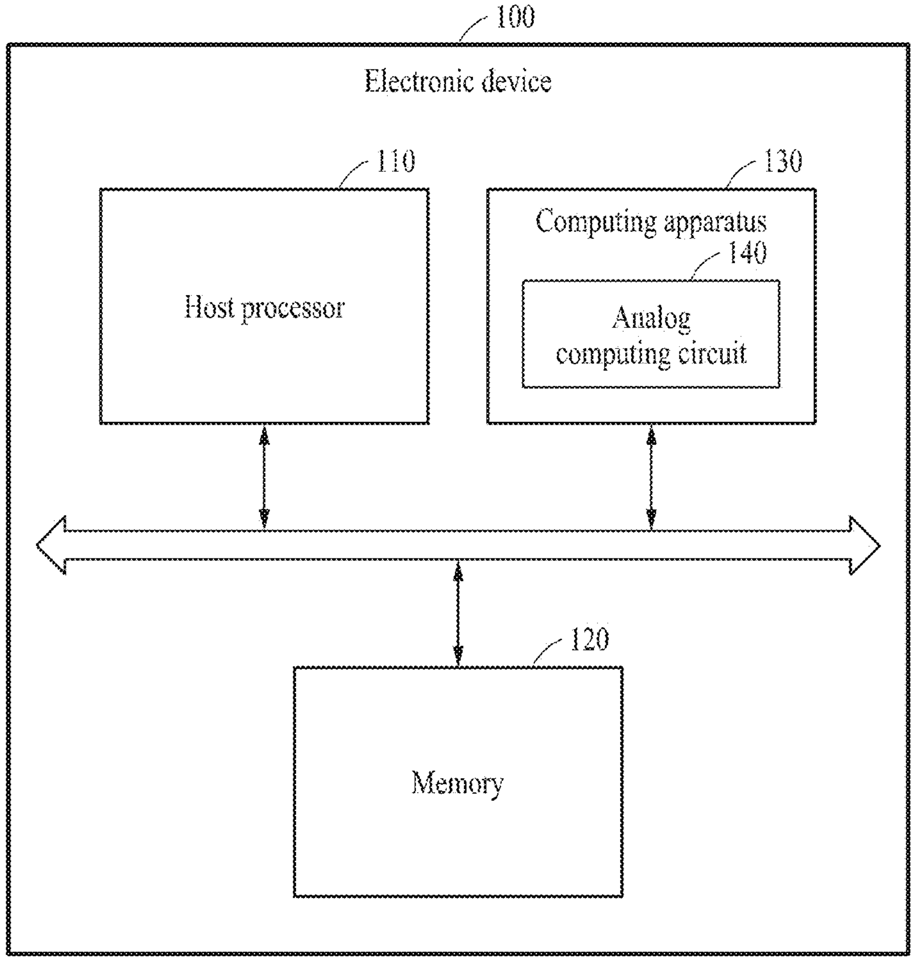
FIG. 1 illustrates an example of an electronic device.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences within and/or of operations described herein are merely examples, and are not limited to those set forth herein, but may be changed as will be apparent after an understanding of the disclosure of this application, except for sequences within and/or of operations necessarily occurring in a certain order. As another example, the sequences of and/or within operations may be performed in parallel, except for at least a portion of sequences of and/or within operations necessarily occurring in an order, e.g., a certain order. Also, descriptions of features that are known after an understanding of the disclosure of this application may be omitted for increased clarity and conciseness.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Throughout the specification, when a component or element is described as "on," "connected to," "coupled to," or "joined to" another component, element, or layer, it may be directly (e.g., in contact with the other component, element, or layer) "on," "connected to," "coupled to," or "joined to" the other component element, or layer, or there may reasonably be one or more other components elements, or layers intervening therebetween. When a component or element is described as "directly on", "directly connected to," "directly coupled to," or "directly joined to" another component element, or layer, there can be no other components, elements, or layers intervening therebetween. Likewise, expressions, for example, "between" and "immediately between" and "adjacent to" and "immediately adjacent to" may also be construed as described in the foregoing.

The terminology used herein is for describing various examples only and is not to be used to limit the disclosure. The articles "a," "an," and "the" are intended to include the plural forms as well, unless the context clearly indicates otherwise. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof, or the alternate presence of an alternative stated features, numbers, operations, members, elements, and/or combinations thereof. Additionally, while one embodiment may set forth such terms "comprise" or "comprises," "include" or "includes," and "have" or "has" specify the presence of stated features, numbers, operations, members, elements, and/or combinations thereof, other embodiments may exist where one or more of the stated features, numbers, operations, members, elements, and/or combinations thereof are not present.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, should be construed to have meanings matching with contextual meanings in the relevant art and the disclosure of the present application, and are not to be construed to have an ideal or excessively formal meaning unless otherwise defined herein.

As used herein, the term "and/or" includes any one and any combination of any two or more of the associated listed items. The phrases "at least one of A, B, and C", "at least one of A, B, or C", and the like are intended to have disjunctive meanings, and these phrases "at least one of A, B, and C", "at least one of A, B, or C", and the like also include examples where there may be one or more of each of A, B, and/or C (e.g., any combination of one or more of each of A, B, and C), unless the corresponding description and embodiment necessitates such listings (e.g., "at least one of A, B, and C") to be interpreted to have a conjunctive meaning.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. The use of the term "may" herein with respect to an example or embodiment (e.g., as to what an example or embodiment may include or implement) means that at least one example or embodiment exists where such a feature is included or implemented, while all examples are not limited thereto. The use of the terms "example" or "embodiment" herein have a same meaning (e.g., the phrasing "in one example" has a same meaning as "in one embodiment", and "one or more examples" has a same meaning as "in one or more embodiments").

Hereinafter, the examples will be described in detail with reference to the accompanying drawings. When describing the examples with reference to the accompanying drawings, like reference numerals refer to like elements and a repeated description related thereto will be omitted.

FIG. 1 illustrates an example of an electronic device.

Referring to FIG. 1, an electronic device 100 may include a host processor 110 (e.g., one or more processors), a memory 120 (e.g., one or more memories), and a computing apparatus 130.

The electronic device 100 may include the host processor 110. Here, the host processor 110, the memory 120, and the computing apparatus 130 may communicate with each other through a bus, network-on-chip (NoC), peripheral component interconnect express (PCIe), and the like. In the example of FIG. 1, only the components related to the example described herein are illustrated as being included in the electronic device 100. Thus, the electronic device 100 may also include other general-purpose components, in addition to the components illustrated in FIG. 1.

The host processor 110 may perform overall functions for controlling the electronic device 100. The host processor 110 may control the electronic device 100 overall by executing programs and/or instructions stored in the memory 120. For example, the host processor 110 may control the computing apparatus 130. The host processor 110 may be implemented as a central processing unit (CPU), a graphics processing unit (GPU), an application processor (AP), and the like, which are included in the electronic device 100. However, examples are not limited thereto.

The memory 120 may be hardware for storing data processed by the electronic device 100 and data to be processed. In addition, the memory 120 may store an application, driver, and the like to be driven by the electronic device 100. The memory 120 may include a volatile memory (e.g., dynamic random-access memory (DRAM)) and/or a nonvolatile memory. For example, the memory 120 may include a non-transitory computer-readable storage medium storing instructions that, when executed by the host processor 110, configure the host processor to perform any one, any combination, or all of the operations and/or methods of the host processor 110.

The electronic device 100 may include the computing apparatus 130 for computations. The computing apparatus 130 may include an analog computing circuit 140 (e.g., one or more analog computing circuits) that performs analog computations. The computing apparatus 130 may be an apparatus that performs computations in a computation-in-memory (CIM) manner that uses the analog computing circuit 140. For example, the computing apparatus 130 may be an apparatus that performs matrix-vector multiplication (MVM) computations in the CIM manner that uses the analog computing circuit 140. The analog computing circuit 140 may have a crossbar array structure including resistive elements (e.g., resistors).

The computing apparatus 130 may be an accelerator and may process tasks that may be processed by a separate dedicated processor (e.g., the accelerator), rather than by the general-purpose host processor 110 due to the characteristics of computations. Here, at least one analog computing circuit 140 included in the computing apparatus 130 may be used.

The computing apparatus 130 may be included in the host processor 110. Alternatively, the computing apparatus 130 may be an accelerator. For example, the computing apparatus 130, as an accelerator, may be a memory configured to perform computations in the CIM manner, and the analog computing circuit 140 may be a circuit configured to perform MVM computations in the CIM manner.

The host processor 110 may include the computing apparatus 130. For example, the computing apparatus 130 may be in the form of a block in the host processor 110.

The analog computing circuit 140 may perform the MVM computations based on multiplication-and-accumulation (MAC) using input signals and weights set in the analog computing circuit 140. Hereinafter, the analog computing circuit 140 is further described.

Figure 2:
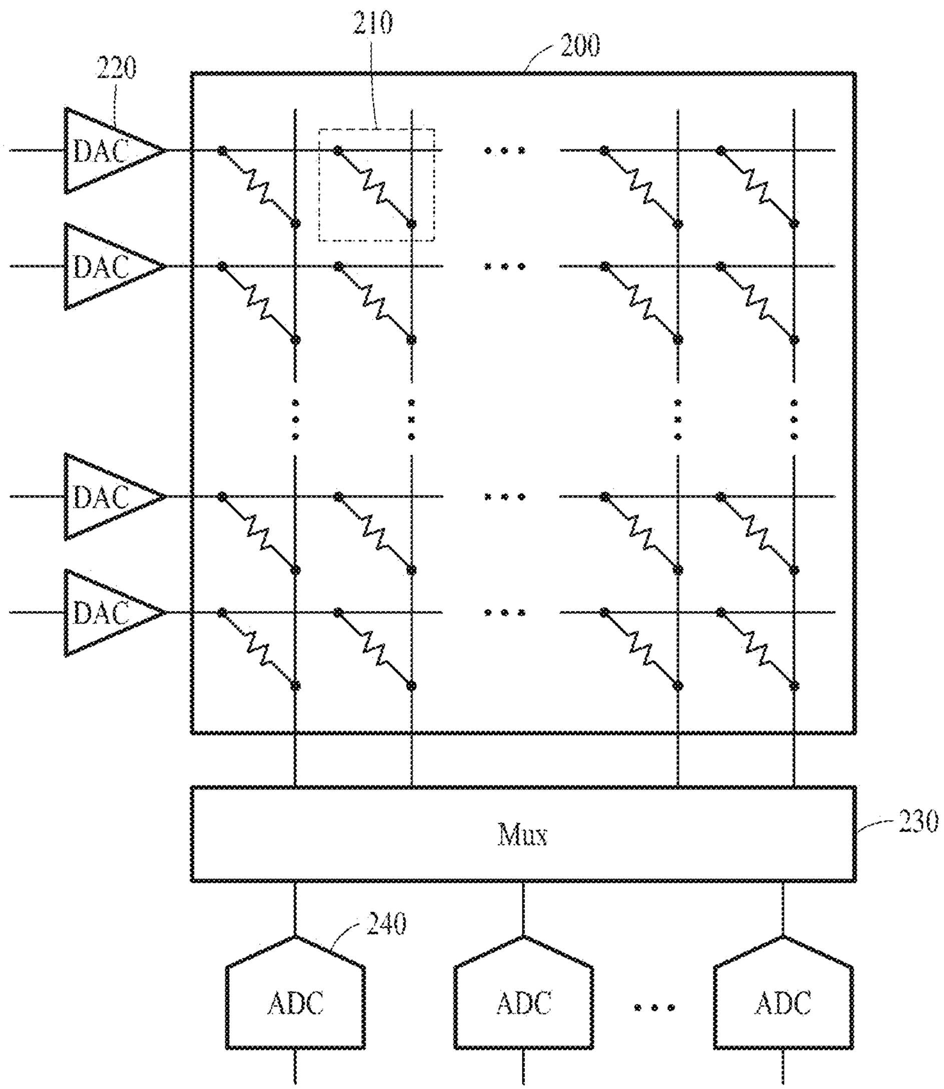
FIG. 2 illustrates an example of an analog computing circuit.

FIG. 2 illustrates an example of an analog computing circuit.

FIG. 2 shows an analog computing circuit 200 including resistive elements 210. For example, the analog computing circuit 200 may have a crossbar array structure. The analog computing circuit 200 may include a plurality of rows to which a data signal is input. The analog computing circuit 200 may include the resistive elements 210, and the resistive elements 210 may connect the plurality of rows to a plurality of columns. For example, in the crossbar array structure, the resistive elements 210 may be disposed at each point of the crossbar and may connect the plurality of rows to the plurality of columns. Here, a resistance value of the resistive elements 210 may represent a value reflecting a weight value in the MVM computation. The analog computing circuit 200 may have the crossbar array structure and may perform the MVM computations in the CIM manner. Magnetic random-access memory (MRAM), phase-change random access memory (PRAM), resistive random-access memory (RRAM), and/or static random-access memory (SRAM) may be used as the resistive elements 210.

Referring to FIG. 2, the plurality of columns may be connected to digital-to-analog converters (DACs) 220, respectively. The analog computing circuit 200 may receive a data signal converted into an analog signal through the DACs 220. The data signal may be multiplied by the weight value while passing through the resistive elements 210, and a computation result accumulated for each column may be output. The computation result accumulated for each column may be input to one or more analog-to-digital converters (ADCs) 240 through a multiplexer (MUX) 230. Unlike the DACs 220 connected to the plurality of rows, the ADCs 240 may not be connected to the plurality of columns. The ADCs 240 may convert computation results received from the connected plurality of columns into digital signals.

Figure 3:
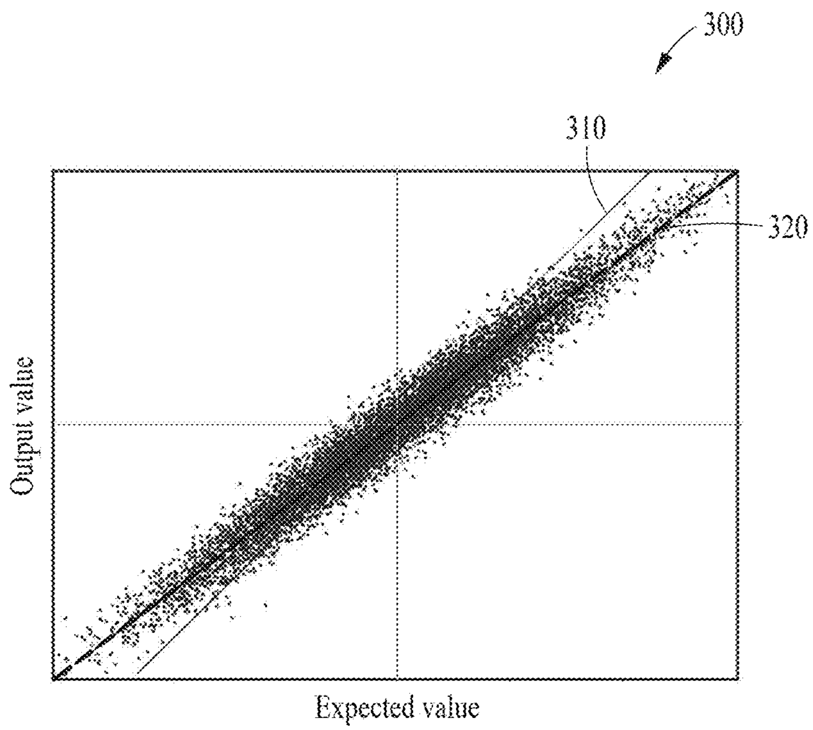
FIG. 3 illustrates an example of calibration of an analog-to-digital converter (ADC) connected to an analog computing circuit.

FIG. 3 illustrates an example of calibration of an ADC connected to an analog computing circuit.

FIG. 3 shows a graph 300 that compares an expected value with an output value of the ADC. A straight line 320 may be a straight line in which an uncalibrated expected value and an uncalibrated output value of the ADC are approximated. For example, a straight line 310 may be y=a*x+b. Here, a may be a gain and b may be an offset. Calibrating (e.g., where the gain is 1 and the offset is 0) the straight line 320 to the straight line 310 in which y is x (e.g., y=x) may refer to ADC calibration. For example, calibrating an error for the ADC such that the output value of the ADC follows the straight line 320 through scaling calibration for the gain and bias calibration for the offset may be referred to as calibration.

Figure 4:
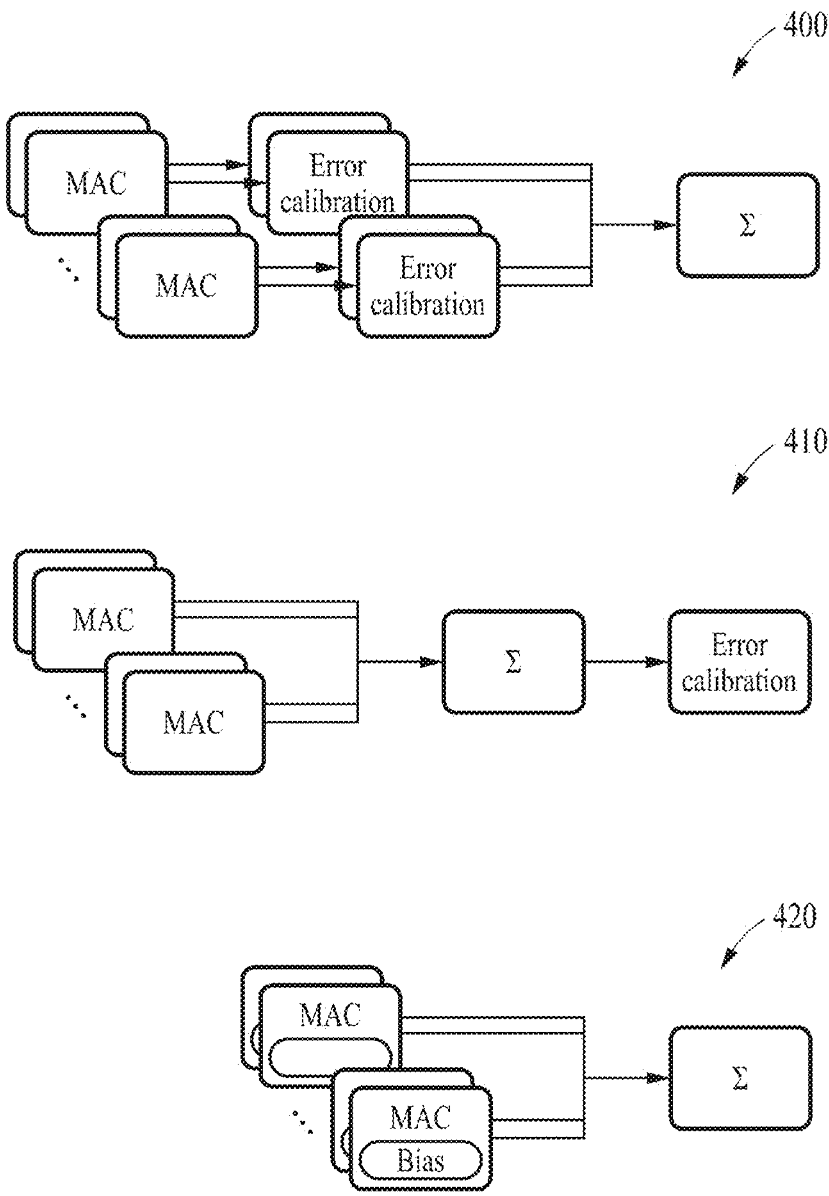
FIG. 4 illustrates an example of error calibration for a plurality of multiplication and accumulation (MAC) operators.

FIG. 4 illustrates an example of error calibration for a plurality of MAC operators.

An error calibration method 400 may be the most ideal error removal method. The error calibration method 400 may calibrate an error for each of MAC computation results and may accumulate the calibrated MAC computation results. However, to perform the error calibration method 400, a technical problem exists in that hardware must be connected to each MAC operator, such the total hardware size may increase. For example, when an ADC is connected to each of a plurality of columns of an analog computing circuit (e.g., the MAC operator) or one ADC is connected to the plurality of columns, an apparatus that individually calibrates an error using the error calibration method 400 must be connected to the ADC after the connection of the ADC, such that the total hardware size may increase.

An error calibration method 410 may be a method of calibrating an error at a time after accumulating MAC computation results first. When performing the error calibration method 410, although the degree of an error of each MAC operator may be different, there may be a technical limitation because the error is calibrated at a time. For example, a calibration value for error calibration may be different for each column due to a deviation in weight values of resistive elements in the analog computing circuit. For example, when analog-to-digital (A2D) conversion is performed on a computation result of the plurality of columns using one ADC, there may be a limitation in operating a separate calibration value for the plurality of columns.

In contrast to the error calibration methods 400 and 410, an error calibration method 420 of one or more embodiments may be a method in which a MAC operator outputs a computation result on which bias calibration is performed and accumulates the output computation result.

Hereinafter, a method in which the MAC operator outputs the computation result on which the bias calibration is performed is described.

Figure 5:
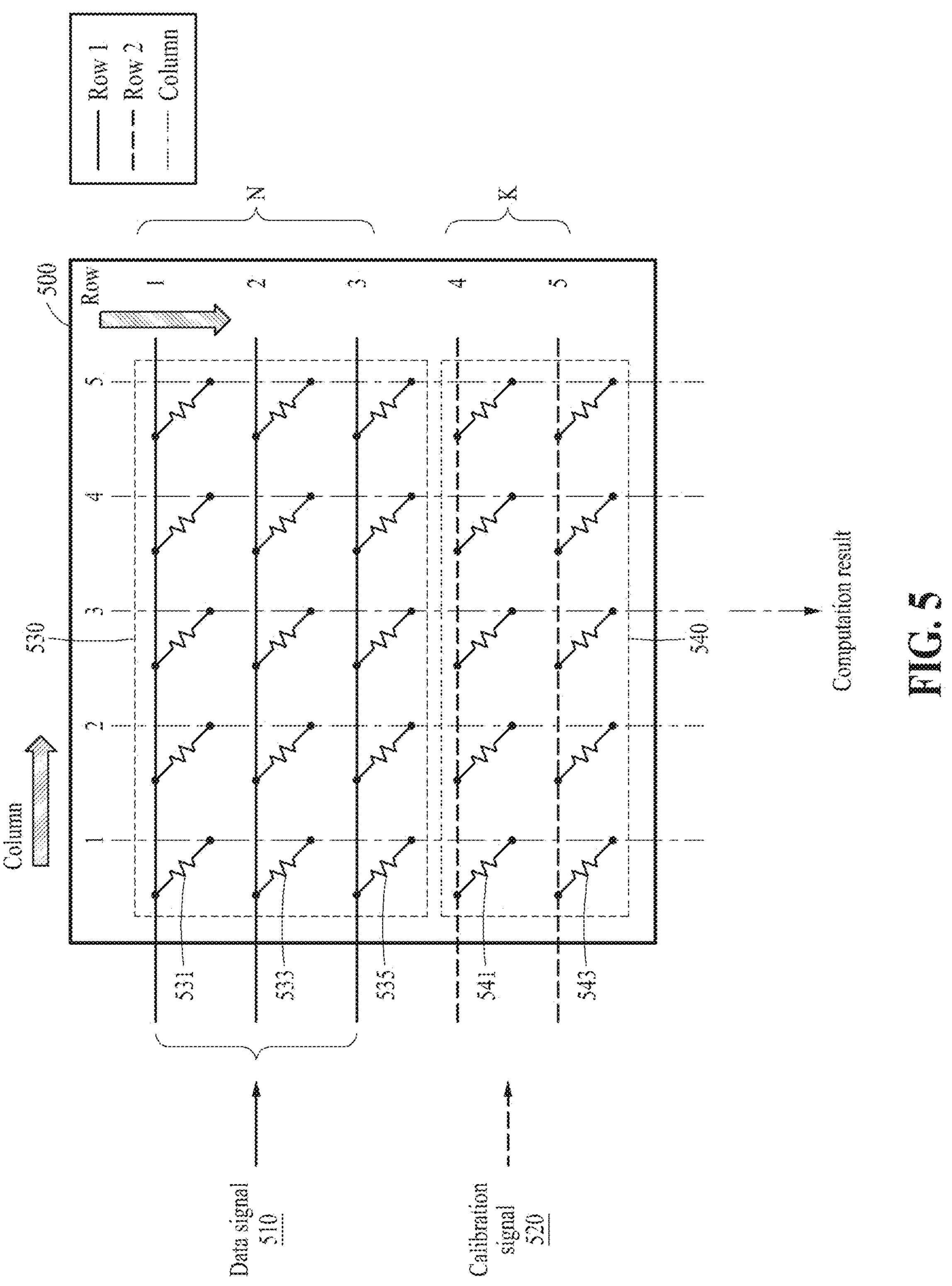
FIGS. 5 to 7 illustrate examples of an analog computing circuit.
Figure 6:
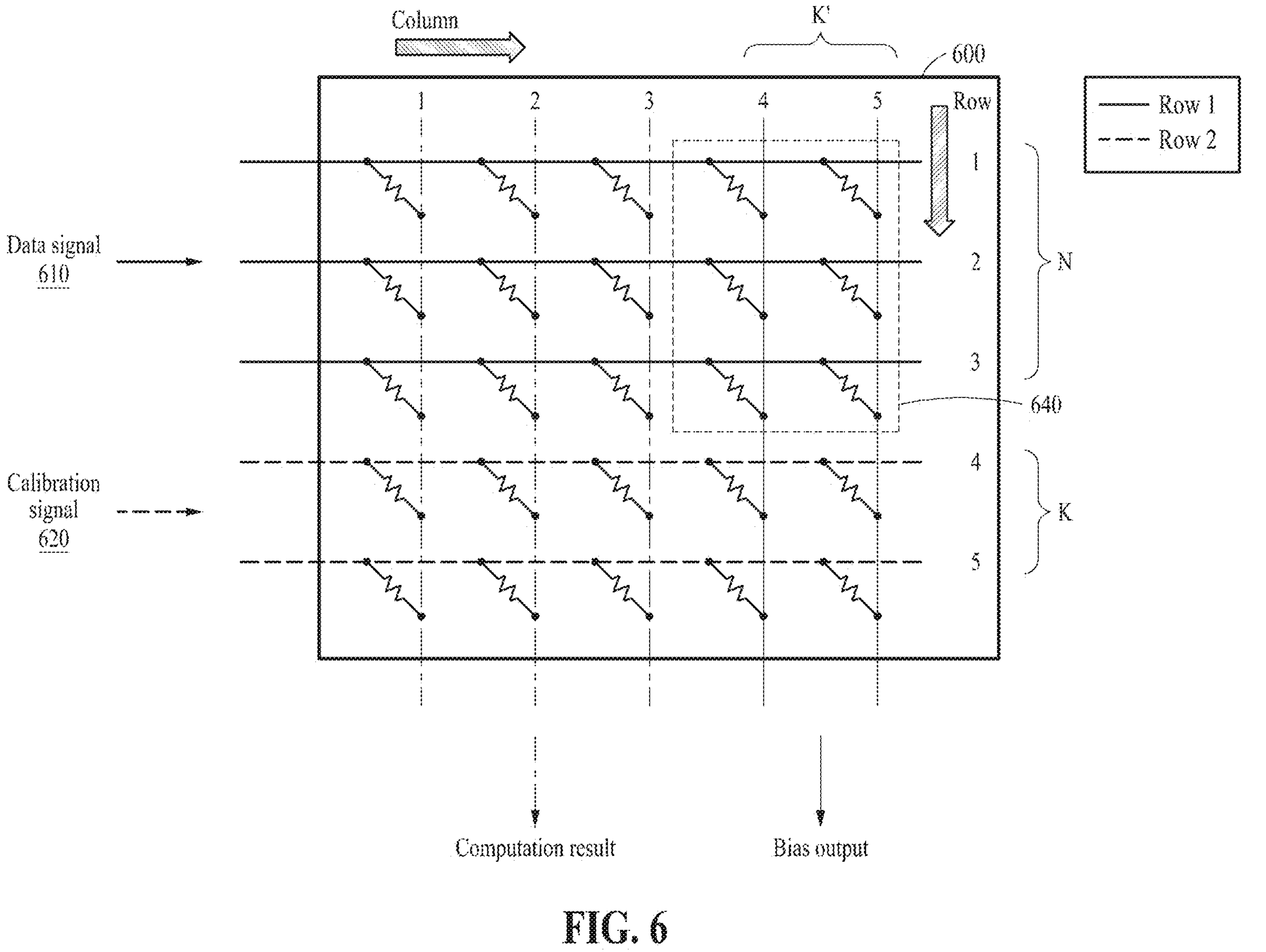
Figure 7:
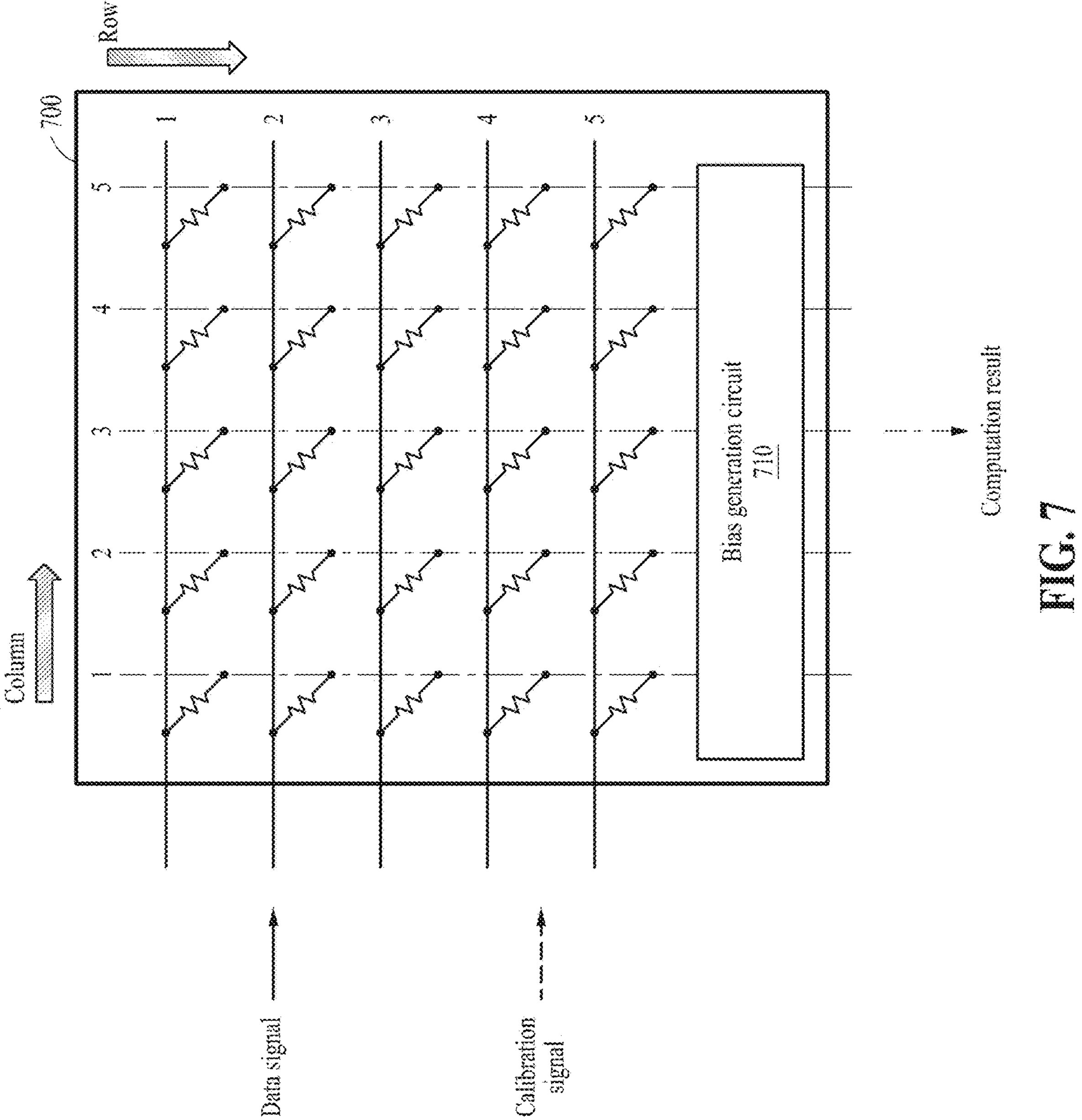

FIGS. 5 to 7 illustrate examples of an analog computing circuit.

FIG. 5 shows an analog computing circuit 500 using a portion of a circuit for bias calibration. The analog computing circuit 500 may be a MAC operator. Hereinafter, for ease of description, the 5×5 analog computing circuit 500 is used. However, the following descriptions may be equally applied to an N×M analog computing circuit. N and M may be natural numbers.

The analog computing circuit 500 may include a plurality of rows. The plurality of rows may include a plurality of first rows to which a data signal 510 for a computation is input and one or more second rows to which a calibration signal 520 for error calibration is input. For example, referring to FIG. 5, the analog computing circuit 500 may include row 1, row 2, and row 3 (e.g., N rows) to which the data signal 510 for a computation is input and may include row 4 and row 5 (e.g., K rows) to which the calibration signal 520 for error calibration is input.

Although not shown in the diagram of FIG. 5, the data signal 510 may be a signal converted into an analog signal through a DAC connected to each of the first rows. Although not shown in the diagram of FIG. 5, the calibration signal 520 may be a signal converted into an analog signal through a DAC connected to each of the second rows.

The plurality of rows may be connected to a plurality of columns. The plurality of rows may be disposed in a crossbar array structure with the plurality of columns. The plurality of columns may be connected to each of the plurality of rows through resistive elements. For example, column 1 may be connected to rows 1 to 5 through the resistive elements. For example, column 2 may be connected to rows 1 to 5 through the resistive elements. For example, each row may be connected to all columns through the resistive elements. When a resistance value of the resistive elements connecting the row to the column is great, this may indicate that the row and the column are connected to each other relatively strongly. When the resistance value of the resistive elements connecting the row and the column decreases, this may indicate that the row and the column may be connected to each other relatively weakly. The resistance value of the resistive elements connecting the row and the column may correspond to a weight.

The plurality of columns may accumulate signals transmitted from the connected plurality of rows in response to an input of the data signal 510 and the calibration signal 520. For example, column 1 may accumulate signals transmitted through rows 1 to 5. For example, column 2 may accumulate signals transmitted through rows 1 to 5.

The signals transmitted from the plurality of rows to the plurality of columns may be signals in which signals input to the plurality of rows are multiplied by a weight value indicated by the resistive elements. For example, column 1 may receive, from row 1, a signal in which the data signal 510 input to row 1 is multiplied by a weight value indicated by a resistive element 531. Column 1 may receive, from row 2, a signal in which the data signal 510 input to row 2 is multiplied by a weight value indicated by a resistive element 533. Column 1 may receive, from row 3, a signal in which the data signal 510 input to row 3 is multiplied by a weight value indicated by a resistive element 535. Column 1 may receive, from row 4, a signal in which the calibration signal 520 input to row 4 is multiplied by a weight value indicated by a resistive element 541. Column 1 may receive, from row 5, a signal in which the calibration signal 520 input to row 5 is multiplied by a weight value indicated by a resistive element 543.

The plurality of columns may output a computation result in which an error is calibrated, by accumulating signals received from the plurality of rows. For example, column 1 may output a computation result in which an error is calibrated, by accumulating signals received from rows 1 to 5.

Resistive elements included in an area 530 may connect the first rows to the plurality of columns. Accordingly, the resistive elements included in the area 530 may have a weight value for computations. For example, the resistive elements included in the area 530 may have a resistance value corresponding to the weight value for computations. Resistive elements included in an area 540 may connect the second rows to the plurality of columns. Accordingly, the resistive elements included in the area 540 may have a weight value for error calibration (e.g., a weight value different than the weight value for computations). For example, the resistive elements included in the area 540 may have a resistance value corresponding to the weight value for the error calibration.

As a result, the analog computing circuit 500 may pre-calibrate an offset of an ADC using a portion of the crossbar array structure as a bias term. The computation of the analog computing circuit 500 may be expressed as Equation 1 below, for example.

$$y_j = \sum_{i=1}^{N} w_{ji} \cdot x_i + \sum_{i=N+1}^{N+K} w_{ji} \cdot b_i \qquad \text{Equation 1}$$

In Equation 1, i denotes a row index and j denotes a column index, w denotes a weight, $w_{ji}$ denotes a weight value indicated by resistive elements positioned at j-th column and i-th row, $x_i$ denotes a data signal input to the i-th row, $b_i$ denotes a calibration signal input to the i-th row, N denotes the number of first rows, and K denotes the number of second rows. Accordingly, the first rows may start from index 1 and the second rows may start from index N+1.

For example, the analog computing circuit 500 may calibrate an offset in the computation result of each column by inputting a predetermined calibration signal to the predetermined number of K second rows and adjusting a weight value of resistive elements connected to the second rows to a value for bias calibration.

For example, it may be assumed that the computation result in column 1 and column 2 is input to any ADC in the analog computing circuit 500. Here, it may be assumed that an offset of column 1 is 0 and an offset of column 2 is +1 when an output value and an expected value of column 1 and an output value and an expected value of column 2 are approximated. For example, a calibration value to set the offset in column 1 to 0 may be 0 and a calibration value to set the offset in column 2 to 0 may be −1. When the ADC operates according to column 1, an output of column 1 may be normal but an error of +1 may occur in the case of column 2. Accordingly, to calibrate this, when K is 1 and N is 3 (e.g., K=1 and N=3), a signal of $b_4=1$ is input to row 4, and $w_{14}=0$ and $w_{24}=-1$ are applied to resistive elements for column 1 and column 2 connected to row 4, a bias of −1 may occur in the computation result of column 2, so the error may be offset in the ADC output result.

When a deviation in the degree of calibration for removing the offset between columns is large, a greater number of second rows may be included in the analog computing circuit 500. For example, K may increase. This may relate to determining a representative calibration value of one or more ADCs connected to the analog computing circuit 500.

The representative calibration value of the ADCs may be determined based on calibration values of columns connected to a corresponding ADC. The representative calibration value of the ADCs may be determined to be an average value for the calibration values of the columns connected to the corresponding ADC. For example, when the calibration values of the columns connected to the corresponding ADC are +1, +3, and +5, respectively, the representative calibration value of the ADCs may be determined to be +3, which is the average of the values.

The representative calibration value of the ADCs may be determined to be the maximum value of the calibration values of the columns connected to the corresponding ADC. For example, when the calibration values of the columns connected to the corresponding ADC are +1, +3, and +5, respectively, the representative calibration value of the ADCs may be determined to be +5, which is the maximum value of the values.

The representative calibration value of the ADCs may be determined to be the minimum value of the calibration values of the columns connected to the corresponding ADC. For example, when the calibration values of the columns connected to the corresponding ADC are +1, +3, and +5, respectively, the representative calibration value of the ADCs may be determined to be +1, which is the minimum value of the values.

The representative calibration value of the ADCs may be determined to be the intermediate value of the calibration values of the columns connected to the corresponding ADC.

The representative calibration value of the ADCs may be determined to be one of the minimum value, maximum value, average value, and/or intermediate value of the calibration values of the columns connected to the corresponding ADC in a range that minimizes the number of one or more second columns (for example, when the number of second columns is small, such that the representative calibration value of the ADCs may not be determined to be the maximum value of the calibration values of the columns connected to the corresponding ADC). Accordingly, the representative calibration of the ADCs may be determined based on the number of second columns. For example, the representative calibration value of the ADCs may be determined in the range that minimizes the number of second columns.

In addition, the representative calibration value of the ADCs may be adjusted by considering a quantization error that occurs while an analog signal is converted into a digital signal.

The resistive elements connecting the second rows to the plurality of columns may have a weight value for removing an offset of each column that is not removed despite error calibration by the representative calibration value of the ADCs. The resistive elements input to the second rows may have a value for removing the offset of each column that is not removed despite the error calibration by the representative calibration value of the ADCs.

The number of K used for bias calibration may be determined based on a range of the offset (e.g., the error) for calibration, a range of the calibration signal 520, and a range of the weight value. The range of the calibration signal 520 and the range of the weight value may be determined differently depending on the hardware specifications of the analog computing circuit 500. For example, when the range of the offset of the plurality of columns is −16 to +15 (e.g., 5 bits), the range of the calibration signal 520 is −4 to +3 (e.g., 3 bits) and the range of the weight value is −2 to +1 (e.g., 2 bits), K=1 alone may be insufficient for error calibration.

Accordingly, the number of K used for the bias calibration may increase as the range of the offset for the error calibration increases. The number of K used for the bias calibration may decrease as the range of the calibration signal 520 and the range of the weight value increase.

The number of rows may be fixed in the analog computing circuit 500. Accordingly, as K increases, N may decrease. N is the number of rows for data computations, and the amount of computations that the analog computing circuit 500 may compute at a time may decrease as N decreases.

In Equation 1, the calibration signal b; may be determined regardless of the data signal 510 input to the analog computing circuit 500 for MAC computations. For example, the calibration signal $b_i$ may be determined to be the maximum value or minimum value of the calibration signal 520 that may be input to the analog computing circuit 500 for minimizing the number of K. Here, the calibration signal $b_i$ may be a calibration signal generated through a separate controller unrelated to an artificial intelligence (AI) model that performs computations.

FIG. 6 shows an analog computing circuit. An analog computing circuit 600 may be a MAC operator. Hereinafter, for ease of description, the 5×5 analog computing circuit 600 is used. However, the following descriptions may be equally applied to an N×M analog computing circuit. N and M may be natural numbers.

The computation result of the analog computing circuit 600 may be used as an input for the next computation. For example, the computation result of the analog computing circuit 600 may be used as an input to a next analog computing circuit (e.g., a next analog computing circuit among a plurality of analog computing circuits 600 included in the computing apparatus 130). Here, among columns of the analog computing circuit 600, the number of columns K' to which a calibration signal of the next analog computing circuit is input may be used as a bias output. For example, the bias output of the analog computing circuit 600 may be used as the calibration signal of the next analog computing circuit. Among resistive elements connected to columns used as the bias output (e.g., columns 4 and 5), a weight value of resistive elements connected to a data signal 610 may be 0. For example, a weight value of resistive elements included in an area 640 may be 0. This may be to prevent the bias output from being affected by the data signal 610. Additionally, the calibration signal of the next analog computing circuit may be generated using computation parameters for scaling calibration and bias calibration, such as batch normalization performed after MAC computations.

An electronic device (e.g., the electronic device 100) of one or more embodiments may monitor whether a computation is being performed normally by configuring weight values used for the bias output to appropriate values. The resistance value of the resistive elements may be changed depending on temperature. For example, the weight value of the resistive elements may be changed. Accordingly, the degree of error calibration may need to be set differently depending on an operating condition of the analog computing circuit 600. For example, it may be assumed that K may be 1 and N may be 3 (e.g., K=1 and N=3). Here, when $w_{44}$ is +1 and $w_{54}$ is −1 (e.g., $w_{44}=+1$ and $w_{54}=-1$), a characteristic of $y_4+y_5=0$ may be obtained. The electronic device may monitor whether the analog computing circuit 600 is operating normally by determining whether the characteristic is maintained in a threshold range. For example, the electronic device may monitor whether the analog computing circuit 600 is operating normally by determining a characteristic of the bias output and monitoring whether the characteristic is maintained in the threshold range. Monitoring may be performed by at least one processor of the electronic device. The at least one processor may be or include a host processor (e.g., the host processor 110).

Rows to which a calibration signal 620 is input and columns from which the bias output is output may be disposed at any position. For example, when a defect occurs at a certain point of the analog computing circuit 600, the MAC computation may be performed normally by disposing the rows for inputting the calibration signal 620 or the columns for outputting the bias output at a certain position. Through this, even when a defect occurs, the electronic device of one or more embodiments may minimize performance degradation.

FIG. 7 shows an analog computing circuit 700.

The analog computing circuit 700 may include a bias generation circuit 710. The bias generation circuit 710 may be a circuit that generates a separate bias using resistive elements to output the same offset for each column. The bias generation circuit 710 may be a circuit that generates the separate bias using the resistive elements to output the same offset of 0 for each column. For example, the computation result of a plurality of columns may have the same offset.

Scaling calibration and bias calibration may be additionally performed on the computation result in FIGS. 5 to 7. For example, post-calibration may be performed on the computation result in FIGS. 5 to 7. An electronic device may calibrate an error of calibration itself of an ADC by performing post-calibration. In addition, the electronic device may calibrate the error caused by the difference between an operating condition that performs the calibration of the ADC and an actual usage condition of the ADC. For example, depending on an AI model, an operating range of the ADC may need to be set differently, and a change of a weight value of the resistive elements may require a hardware setting. Accordingly, it may be easier to perform post-processing instead of changing the weight value of the resistive elements.

Figure 8:
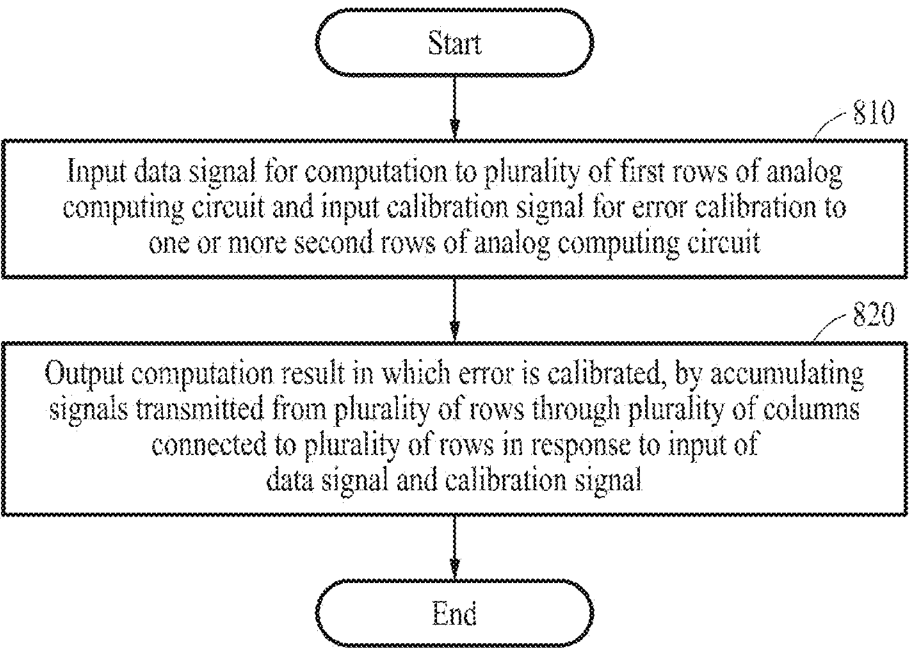
FIG. 8 illustrates an example of an operating method of an electronic device.

FIG. 8 illustrates an example of an operating method of an electronic device.

In the following examples, operations 810 and 820 may be performed sequentially but not necessarily. For example, the order of the operations may be changed and at least two of the operations may be performed in parallel. Operations shown in FIG. 8 may be performed by at least one component of an electronic device.

In operation 810, the electronic device may input a data signal for computations to a plurality of first rows of an analog computing circuit and may input a calibration signal for error calibration to one or more second rows of the analog computing circuit.

In operation 820, the electronic device may output a computation result in which an error is calibrated, by accumulating signals transmitted from a plurality of rows through a plurality of columns connected to the plurality of rows in response to an input of the data signal and the calibration signal.

The plurality of rows may include the plurality of first rows and the one or more second rows.

The description provided with reference to FIGS. 1 to 7 may also apply to an operating method of the electronic device of FIG. 8, so the description below is omitted.

Figure 9:
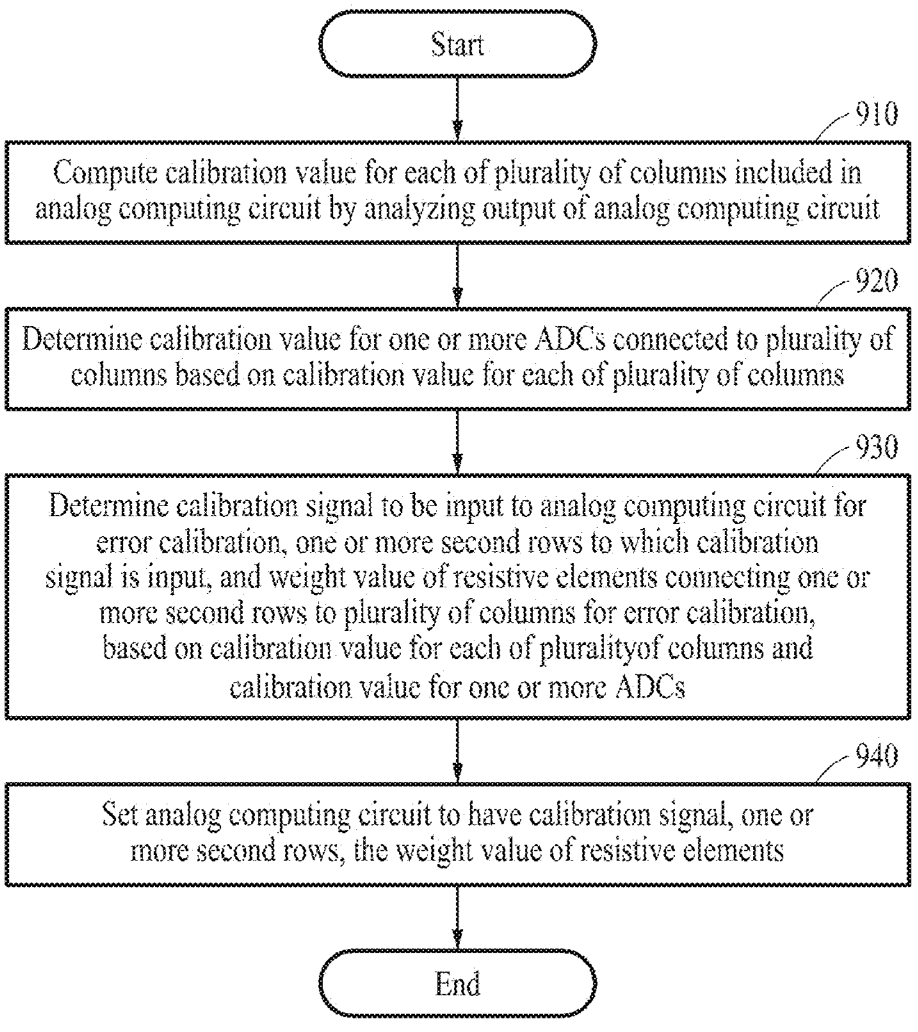
FIG. 9 illustrates an example of a manufacturing method of an analog computing circuit.

FIG. 9 illustrates an example of a manufacturing method of an analog computing circuit.

In the following examples, operations 910 to 940 may be performed sequentially but not necessarily. For example, the order of the operations may be changed and at least two of the operations may be performed in parallel. The operations for performing the manufacturing method shown in FIG. 9 may be performed by a manufacturing apparatus.

In operation 910, the manufacturing apparatus may compute a calibration value for each of a plurality of columns included in an analog computing circuit by analyzing an output of the analog computing circuit.

The manufacturing apparatus may determine a calibration value for removing an offset for each of the plurality of columns included in the analog computing circuit. For example, the manufacturing apparatus may compute a bias error for removing the offset for each of the plurality of columns.

In operation 920, the manufacturing apparatus may determine a calibration value for one or more ADCs connected to the plurality of columns based on the calibration value for each of the plurality of columns.

The manufacturing apparatus may determine a calibration value for the one or more ADCs based on the calibration value of columns connected to the ADC. For example, a representative calibration value of the ADC may be determined based on the calibration value of the columns connected to the ADC.

In operation 930, the manufacturing apparatus may determine a calibration signal to be input to the analog computing circuit for error calibration, one or more second rows to which the calibration signal is input, and a weight value of resistive elements connecting the one or more second rows to the plurality of columns for the error calibration, based on the calibration value for each of the plurality of columns and the calibration value for the one or more ADCs.

In operation 940, the manufacturing apparatus may set the analog computing circuit to have the calibration signal, the one or more second rows, and the weight value of the resistive elements.

The analog computing circuit set to have the calibration signal, the one or more second rows, and the weight value of the resistive elements may be installed in an electronic device and may perform MAC computations.

The host processors, memories, computing apparatuses, analog computing circuits, resistive elements, DACs, MUXs, ADCs, bias generation circuits, host processor 110, memory 120, computing apparatus 130, analog computing circuit 140, analog computing circuit 200, resistive elements 210, DACs 220, MUX 230, ADCs 240, analog computing circuit 500, resistive element 531, resistive element 533, resistive element 535, resistive element 541, resistive element 543, analog computing circuit 600, analog computing circuit 700, and bias generation circuit 710 described herein, including descriptions with respect to respect to FIGS. 1-9, are implemented by or representative of hardware components. As described above, or in addition to the descriptions above, examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. As described above, or in addition to the descriptions above, example hardware components may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in, and discussed with respect to, FIGS. 1-9 that perform the operations described in this application are performed by computing hardware, for example, by one or more processors or computers, implemented as described above implementing instructions (e.g., computer or processor/processing device readable instructions) or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media, and thus, not a signal per se. As described above, or in addition to the descriptions above, examples of a non-transitory computer-readable storage medium include one or more of any of read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and/or any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above and all drawing disclosures, the scope of the disclosure is also inclusive of the claims and their equivalents, i.e., all variations within the scope of the claims and their equivalents are to be construed as being included in the disclosure.

What is claimed is:

1. An electronic device comprising:

an analog computing circuit comprising:

a plurality of rows comprising a plurality of first rows to which a data signal for computations is input and one or more second rows to which a calibration signal for error calibration is input; and a plurality of columns connected to the plurality of rows and configured to output a computation result in which an error is calibrated, by accumulating signals transmitted from the connected plurality of rows in response to an input of the data signal and the calibration signal.

2. The electronic device of claim 1, wherein the plurality of rows is connected to the plurality of columns through resistive elements, and resistive elements, among the resistive elements, connecting the one or more second rows to the plurality of columns have a weight value for the error calibration.

3. The electronic device of claim 1, wherein the plurality of columns is connected to one or more analog-to-digital converters (ADCs), and a calibration signal transmitted to columns connected to one of the one or more ADCs and a weight value of resistive elements connected to the columns connected to the one of the one or more ADCs are determined based on calibration values of the columns connected to the one of the one or more ADCs and a calibration value of one of the one or more ADCs.

4. The electronic device of claim 3, wherein the calibration value of the one of the one or more ADCs is determined to be either one of:

a value determined based on the calibration values of the columns; and one of the calibration values of the columns.

5. The electronic device of claim 3, wherein the calibration value of the one of the one or more ADCs is determined to be an average value of the calibration values of the columns connected to the one of the one or more ADCs.

6. The electronic device of claim 3, wherein the calibration value of the one of the one or more ADCs is determined to be a maximum value of the calibration values of the columns connected to the one of the one or more ADCs.

7. The electronic device of claim 3, wherein the calibration value of the one of the one or more ADCs is determined to be a minimum value of the calibration values of the columns connected to the one of the one or more ADCs.

8. The electronic device of claim 1, wherein a number of the one or more second rows is determined based on a range of an error for the error calibration, a range of the calibration signal, and a range of a weight value that resistive elements connecting the one or more second rows to the plurality of columns are configured to have.

9. The electronic device of claim 1, wherein an amount of computations that the analog computing circuit is configured to compute at a time decreases as a number of the one or more second rows increases.

10. The electronic device of claim 1, wherein, in response inputting to the computation result of the analog computing circuit to another analog computing circuit, a computation result of one or more columns of the plurality of columns is input to the other analog computing circuit for error calibration of the other analog computing circuit.

11. The electronic device of claim 10, wherein a weight value of resistive elements that transmit the data signal is 0 among resistive elements connected to the one or more columns of the plurality of columns.

12. The electronic device of claim 1, further comprising:

one or more processors configured to:

control the electronic device; and monitor whether the analog computing circuit operates normally based on a computation result of columns connected to one of one or more ADCs connected to the plurality of columns.

13. A processor-implemented method comprising:

inputting a data signal for computations to a plurality of first rows of an analog computing circuit and inputting a calibration signal for error calibration to one or more second rows of the analog computing circuit; and outputting a computation result in which an error is calibrated, by accumulating signals transmitted from a plurality of rows through a plurality of columns connected to the plurality of rows in response to an input of the data signal and the calibration signal, wherein the plurality of rows comprises the plurality of first rows and the one or more second rows.

14. The method of claim 13, wherein the plurality of rows is connected to the plurality of columns through resistive elements, and resistive elements, among the resistive elements, connecting the one or more second rows to the plurality of columns have a weight value for the error calibration.

15. The method of claim 13, wherein the plurality of columns is connected to one or more analog-to-digital converters (ADCs), and a calibration signal transmitted to columns connected to one of the one or more ADCs and a weight value of resistive elements connected to the columns connected to the one of the one or more ADCs are determined based on a calibration value of the columns connected to the one of the one or more ADCs and a calibration value of the one of the one or more ADCs.

16. The method of claim 13, wherein a number of the one or more second rows is determined based on a range of an error for the error calibration, a range of the calibration signal, and a range of a weight value that resistive elements connecting the one or more second rows to the plurality of columns are configured to have.

17. The method of claim 13, wherein an amount of computations that the analog computing circuit is configured to compute at a time decreases as a number of the one or more second rows increases.

18. The method of claim 13, further comprising, in response to inputting the computation result of the analog computing circuit to another analog computing circuit, inputting a computation result of one or more columns of the plurality of columns to the other analog computing circuit for error calibration of the other analog computing circuit.

19. The method of claim 13, further comprising monitoring whether the analog computing circuit operates normally based on a computation result of columns connected to one of one or more ADCs.

20. A manufacturing method comprising:

computing a calibration value for each of a plurality of columns comprised in an analog computing circuit by analyzing an output of the analog computing circuit;

determining a calibration value for one or more analog-to-digital converters (ADCs) connected to the plurality of columns based on the calibration value for each of the plurality of columns;

determining a calibration signal to be input to the analog computing circuit for error calibration, one or more second rows to which the calibration signal is input, and a weight value of resistive elements connecting the one or more second rows to the plurality of columns for the error calibration, based on the calibration value for each of the plurality of columns and the calibration value for the one or more ADCs; and setting the analog computing circuit to have the calibration signal, the one or more second rows, and the weight value of the resistive elements.

* * * * *